(12) United States Patent
Suzuki et al.

(10) Patent No.: US 6,392,483 B2
(45) Date of Patent: May 21, 2002

(54) FEED-FORWARD AMPLIFIER

(75) Inventors: Yasunori Suzuki, Yokohama; Toshio Nojima, Yokosuka, both of (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 09/854,476

(22) Filed: May 15, 2001

(30) Foreign Application Priority Data

May 18, 2000 (JP) .................................. 2000-146327

(51) Int. Cl.[7] ................................................ H03F 1/00
(52) U.S. Cl. ...................................... 330/151; 330/149
(58) Field of Search ......................... 330/52, 149, 151

(56) References Cited

U.S. PATENT DOCUMENTS

| | | | | |
|---|---|---|---|---|
| 5,877,653 A | * | 3/1999 | Kim et al. | .................. 330/149 |
| 6,046,635 A | * | 4/2000 | Gentzler | .................. 330/149 |
| 6,211,733 B1 | * | 4/2001 | Gentzler | .................. 330/149 |
| 6,320,464 B1 | * | 11/2001 | Suzuki et al. | .............. 330/151 |

* cited by examiner

*Primary Examiner*—Benny Lee
*Assistant Examiner*—Henry Choe
(74) *Attorney, Agent, or Firm*—Oblon, Spivak, McClelland, Maier & Neustadt, P.C.

(57) ABSTRACT

In a feed-forward amplifier a signal power dynamic range compressing circuit for compressing the power dynamic range of the input signal to the feed-forward amplifier is provided in a distortion detecting loop at the input side of a main amplifier, and the output backoff of the main amplifier is reduced to thereby achieve high-efficiency amplification of the feed-forward amplifier.

23 Claims, 12 Drawing Sheets

FEED-FORWARD AMPLIFIER

BACKGROUND OF THE INVENTION

The present invention relates to a feed-forward amplifier that is used mainly for high-frequency power amplification in multi-carrier radio communications and a high-efficiency power amplifying method using the feed-forward amplifier.

Recently multi-carrier radio communication schemes are widespread which permit high-speed transmission through the use of plural narrow-band carriers. As compared with a single-carrier communication, the multi-carrier transmission is less susceptible to fading or some other influences of propagation path variations, and hence it is more robust against delayed waves. Furthermore, the multi-carrier radio communication which use plural narrow-band carriers possesses the advantages of simplifying radio circuitry and relaxing the requirements imposed on the radio circuit used.

The multi-carrier radio communication schemes, which are advantageous for high-speed transmission as mentioned above, have been practiced in microwave communications and a multi-channel access system.

In recent years there has been proposed an OFDM (Orthogonal Frequency Division Multiplexing) radio communication scheme intended for high-speed transmission in the microwave band. In the field of broadcasting the application of the OFDM system to the next-generation digital television is now under study.

These multi-carrier radio communication schemes contain various features, but they have such problems as an increase in out-of-band leakage power due to intermodulation distortion by transmitters and the occurrence of intersymbol interference. The intermodulation distortion by transmitters occurs, for example, in a frequency converter or power amplifier. In particular, the influence of the nonlinearity of the power amplifier is serious. In this reason, the multi-carrier radio communication is indispensable of linear power amplification. As a linear power amplifier, a feed-forward amplifier is well-known as a power amplifier capable of removing the nonlinear distortion. The feed-forward amplifier consists of a distortion detecting loop containing a main amplifier and a distortion canceling loop containing an auxiliary amplifier.

In general, simultaneous amplification of two or more carriers by a power amplifier will generate the intermodulation distortion unless the output backoff of the power amplifier is provided corresponding to PAPR (Peak-to-Average Power Ratio). Accordingly, the power amplifier needs to be sufficiently high in its saturation output power as compared with the average power of the output signal; this degrades the amplification efficiency. The same is true of the main amplifier in the feed-forward amplifier.

The efficiency of the main amplifier can be enhanced by means of a push-pull circuit of Class-B bias condition or the like. The nonlinear distortion by the main amplifier can be compensated for by a conventional feed-forward amplifier. According to, for instance, literature (Toshio NOJIMA and Shoichi NARAHASHI, "Extremely Low-Distortion Multi-Carrier Amplifier for Mobile Communication Systems," Technical Report of IEICEJ Radio Communication System Study Group, RCS90-4, 1990), in the case where the saturation output of the main amplifier is 100 W, the saturation output of the auxiliary amplifier is ⅛ that of the main amplifier. GaAs-MESFETs (Metal Semiconductor Field Effect Transistors) are used as semiconductor amplifying elements of the main and auxiliary amplifiers. If the drain voltage and current of the MESFET of the main amplifier and auxiliary amplifier operated on 1.5-GHz band are 12 V, 20 A, and 12V, 5 A respectively, the drain efficiency of the feed-forward amplifier is about 5% or below under the Class-A bias condition. By using a Class-B push-pull amplifier or similar high-efficiency amplifier circuit and a Class-A amplifier circuit as the main amplifier and the auxiliary amplifier of the feed-forward amplifier, respectively, it is possible to obtain a drain efficiency of approximately 10% or below.

Moreover, enhancement of the power efficiency of the feed-forward amplifier requires further improvement of the drain efficiency of the main amplifier. As a method for performing high-efficiency amplification while achieving linear amplification, there has been proposed a method using a drain voltage control scheme (Koji CHIBA, Toshio NOJIMA and Shigeru TOMISATO, "Bi-Directional Feed-Forward Drain-Voltage-Controlled Amplifier (BDF-DVCA)", Technical Report of IEICEJ Radio Communication System Study Group, RCS89-33, 1989). This method increases the drain efficiency by an equivalent reduction of the output backoff of the amplifier using drain voltage control.

The drain voltage control scheme modulates the power to be supplied to such a semiconductor device as a FET. For example, in a base-station power amplifier of a 100-W average output power, if the drain efficiency of a final-stage FET is 50% (which is theoretically maximum under the Class-A bias condition), the power supply to the final-stage FET is 200 W. When the drain voltage of the FET is 10 V, the drain current is 20 A. Control of such a large current is effected by the FET or the like. With higher-output power amplifiers, however, it becomes more difficult to achieve low-loss drain voltage control due to a loss such as an on internal resistance of the FET that controls the large current.

SUMMARY OF THE INVENTION

It is therefore an object of the present invention to provide a method that reduces the output backoff of the main amplifier while retaining a distortion compensating ability equal to or higher than that of the conventional feed-forward amplifier, and a high-efficiency feed-forward amplifier using the method.

According to the present invention, there is provided a feed-forward amplifier that has a distortion detecting loop for detecting a distortion component and a distortion canceling loop following to the distortion detecting loop, for canceling the distortion component and amplifies the power of an input transmission signal, wherein:

the distortion detecting loop comprises:

a main amplifier path containing a main amplifier;

a signal power dynamic range compressing circuit inserted in the main amplifier path at the input side of the main amplifier, for compressing the power dynamic range of the input signal;

a first linear signal transfer path;

a first directional coupler for dividing the transmission signal to the main amplifier path and the first linear signal transfer path; and a second directional coupler for power-combining the output signals from the main amplifier path and the first linear signal transfer path and for dividing the combined output signal to two combined outputs;

the distortion canceling loop comprises:

a second linear signal transfer path supplied with the one combined output from the second directional coupler, for transferring the supplied combined output;

an auxiliary amplifier path containing the auxiliary amplifier and supplied with the other combined output from the second directional coupler, for transferring the supplied combined output; and a third directional coupler for power-combining the outputs from the second linear signal transfer path and the auxiliary amplifier path and for outputting the power-combined transmission signal; and the signal power dynamic range compressing circuit comprises:

a fourth directional coupler for dividing a signal on the main amplifier path to two signals and for outputting the two divided signals;

a third linear signal transfer path for linearly transferring the one of the two divided signals from the fourth directional coupler;

a compressing signal generator for generating a compressing signal that makes the envelope of the one divided signal constant based on the other divided signal from the fourth directional coupler; and a fifth directional coupler for power-combining the output signal from the third linear signal transfer path and the compressing signal from the compressing signal generator and for providing the power-combined output to the main amplifier.

DETAILED DESCRIPTION OF THE PREFERRED EMBODIMENTS

Figure 1:
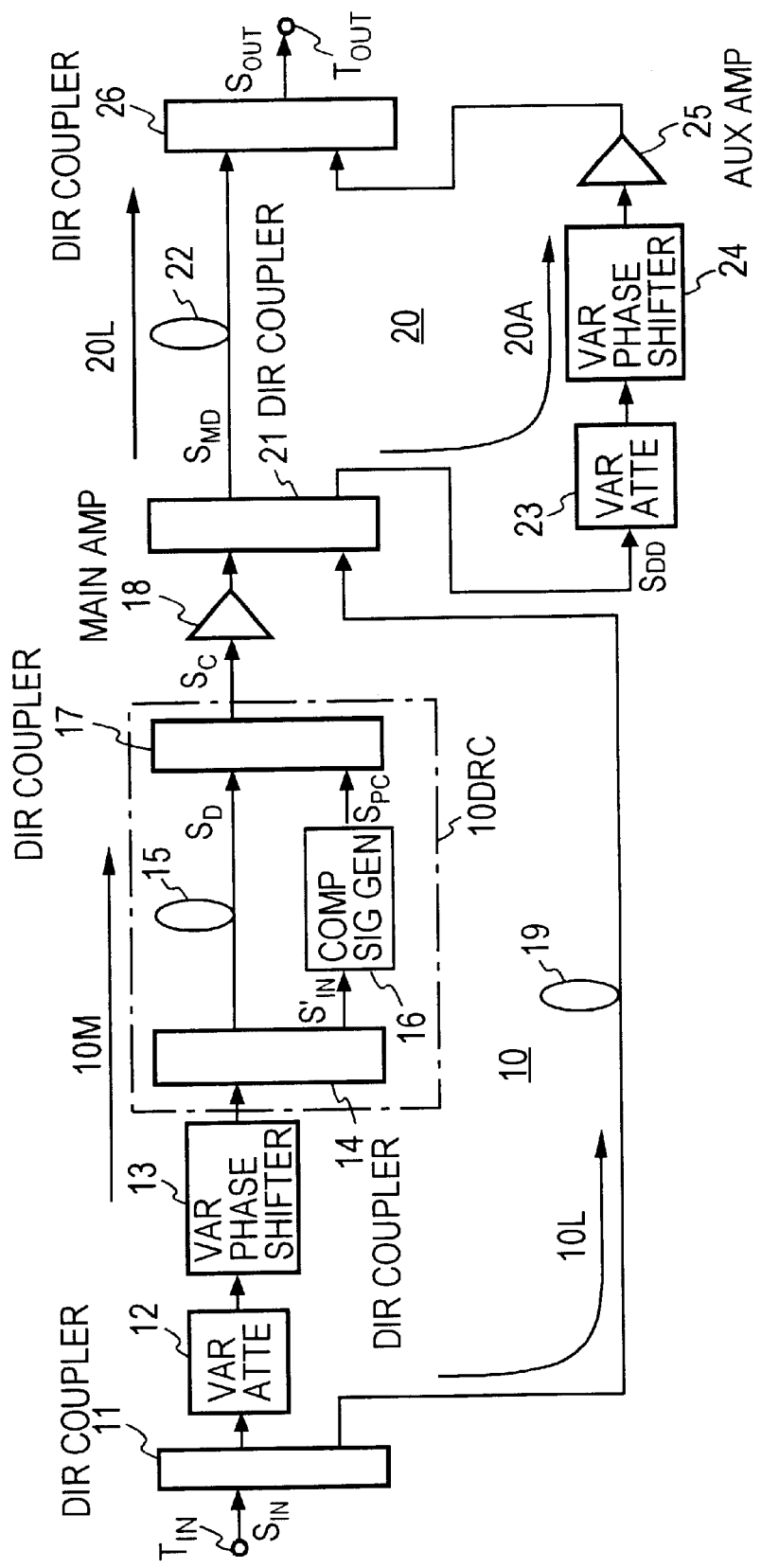
FIG. 1 is a diagram illustrating the basic circuit construction of the feed-forward amplifier according to the present invention.

FIG. 1 illustrates in block form the basic construction of the feed-forward amplifier according to the present invention. As depicted in FIG. 1, the feed-forward amplifier comprises: a directional coupler 11 for dividing an input signal (which is also a transmission signal to be transmitted via the feed-forward amplifier) $S_{IN}$ at an input terminal $T_{IN}$ to a main amplifier signal transfer path 10M and a linear signal transfer path 10L; a variable attenuator 12, a variable phase shifter 13, a signal power dynamic range compressing circuit 10DRC and a main amplifier 18 interposed in series with the main amplifier signal transfer path 10M; a delay line 19 forming a linear signal transfer path 10L; a directional coupler 21 that generates sum and difference components of the outputs from the main amplifier signal transfer path 10M and the linear signal transfer path 10L and outputs them to a main signal transfer path 20L formed by a delay line 22 and a distortion canceling path 20A (or also called an auxiliary amplifier signal transfer path) 20A; a variable attenuator 23, a variable phase shifter 24 and an auxiliary amplifier 25 interposed in series with the distortion canceling path 20A; and a directional coupler 26 for power-combining the outputs from the main signal transfer path 20L and the distortion canceling path 20A.

The main amplifier signal transfer path 10M and the linear signal transfer path 10L constitute a distortion detecting loop for detecting a distortion that occurs in the main amplifier signal transfer path 10M. The main signal transfer path 20L and the distortion canceling path 20A constitute a distortion canceling loop for canceling the distortion detected by the distortion detecting loop 10. The feed-forward amplifier formed by such two loops 10, 20, except the signal power dynamic range compressing circuit 10DRC, is well-known in the art.

The signal power dynamic range compressing circuit 10DRC comprises: a directional coupler 14 that distributes the input signal to the delay line 15 and a compressing signal generator 16; the delay line 15; the compressing signal generator 16; and a directional coupler 17 that power-combines the outputs from the delay line 15 and the compressing signal generator 16 and provides the combined output to the main amplifier 18. The compressing signal generator 16 generates a signal $S_{PC}$ for compressing the peak power or PAPR of the input signal $S_C$ to the main amplifier 18.

The input signal $S_{IN}$ is divided by the directional coupler 11 to two signals. The one of the two divided signals is provided via the variable attenuator 12 and the variable phase shifter 13 to the directional coupler 14 of the signal power dynamic range compressing circuit 10DRC. The signal fed to the directional coupler 14 is subdivided to two signals, which are provided via the delay line 15 and the compressing signal generator 16, respectively, to the directional coupler 17, wherein they are combined together. The combined output signal $S_C$ is fed to the main amplifier 18. The output signal from the main amplifier 18, which contains a distortion component, is fed to the directional coupler 21. The other of the two signals divided by the directional coupler 11 is provided via the delay line 19 to the directional coupler 21.

The output signal $S_{MD}$ from the directional coupler 21 provided via the delay line 22 to the directional coupler 26. A signal $S_{DD}$, which is an anti-phase combined version of the output signals from the main amplifier 18 and the delay line 19, is provided via the variable attenuator 23, the variable phase shifter 24 and the auxiliary amplifier 25 to the directional coupler 26.

Further, the output signals from the delay line 22 and the auxiliary amplifier 25 are anti-phase combined by the directional coupler 26. The thus anti-phase combined output signal $S_{OUT}$ is provided to an amplifier output terminal $T_{OUT}$.

In the feed-forward amplifier of FIG. 1 each of the directional directors 11, 14, 17, 21 and 26 may be formed by a power combiner.

Figure 2:
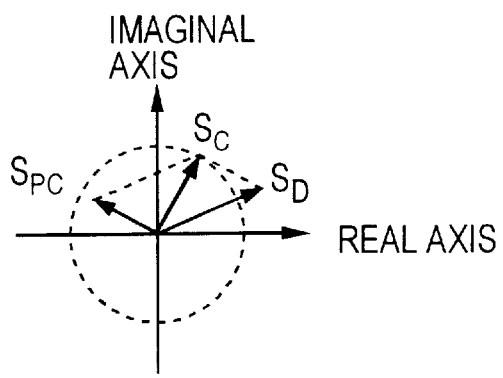
FIG. 2 is a diagram showing the vector of a power amplifier input, for explaining how a compressing signal works.

With reference to FIG. 2 showing the vector of the input signal to the main amplifier 8, a description will be given of the principles of operation of the feed-forward application according to the present invention. The compressing signal generator 16 is to generate the compressing signal $S_{PC}$ that is combined with a signal $S_D$ on the delay line 15 to produce a combined signal vector $S_C$ such that the signal vector $S_D$ becomes constant in amplitude. As will be described later on, as the compressing signal generator 16 there are a circuit that generates the compressing signal $S_{PC}$ for compressing the peak power of the input signal and a circuit that generates the compressing signal $S_{PC}$ for compressing the PAPR. The signal power dynamic range compressing circuit 10DRC compresses the peak power or PAPR of the input signal $S_{IN}$ to the main amplifier 18.

In the case of compressing the peak power, the compressing signal generator 16 generates the compressing signal vector $S_{PC}$ that is nearly 180° out of phase with the signal vector $S_D$ as shown in FIG. 2. In this instance, as described in detail later on, the compressing signal generator 16 detects the peak power of an input signal $S'_{IN}$. The amplitude and phase of the input signal are detected by its simultaneous detection. The compressing signal generator 16 generates the compressing signal vector $S_{PC}$ that makes the amplitude of the signal vector $S_C$ a constant value. In this example, the compressing signal generator 16 produces, by its low-frequency oscillator, a tone signal (a single-frequency signal) that is 180° out of phase with the input signal, for instance. As a result, the signal vector $S_C$ produced by the directional coupler 17 can be made constant. Having thus generated the compressing signal $S_{PC}$, the compressing signal generator 16 holds its output until the detection of a peak power equal to or larger than a preset threshold value.

As described above, the signal power dynamic range compressing circuit 10DRC generates a peak-power-compressed combined signal $S_C$ that holds the output back-off of the main amplifier 18 within a desired range. The compressing signal $S_{PC}$ injected into the signal $S_D$ is regarded as a distortion generated in the main amplifier signal transfer path 10M, and hence it is detected by the distortion detecting loop 10 and removed by a distortion canceling loop 20. It must be noted here that the peak-power-compressed combined signal $S_C$ permits high-efficiency amplification of the main amplifier 18 and decompression of the peak power component of the main amplifier input signal $S_D$ through rejection or cancellation of the compressed signal component contained in the main amplifier output in the distortion canceling loop 20.

Figure 3A:
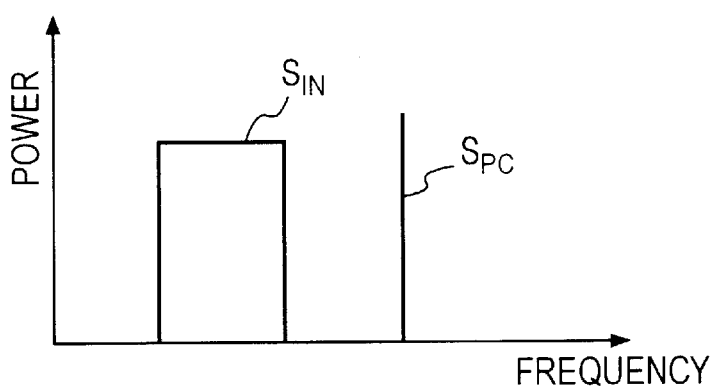
FIG. 3A is a graph showing the spectra of an input signal and a peak voltage compressing signal.
Figure 3B:
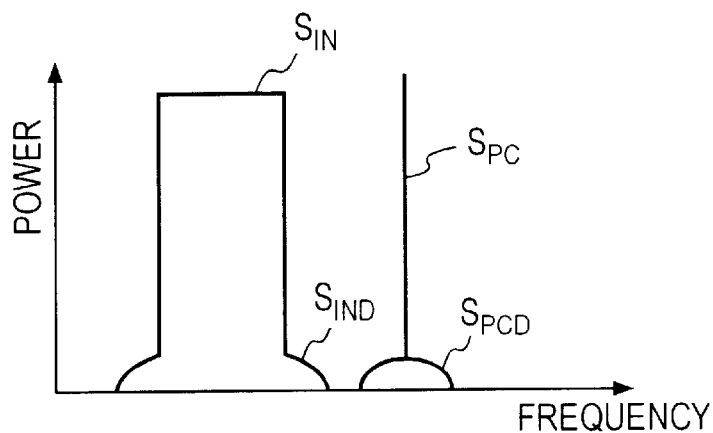
FIG. 3B is a graph showing the spectrum of a main amplifier output signal.
Figure 3C:
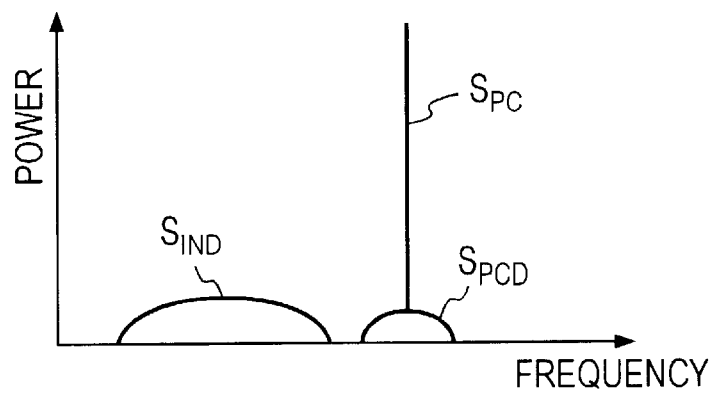
FIG. 3C is a graph showing the spectrum of a distortion detected by a distortion detecting loop.

The compressing signal $S_{PC}$ produced by the compressing signal generator 16 is, for example, a single-frequency signal (which is referred to also as a tone signal), which is frequency-converted to a band which is either different from or the same as the band of the feedforward amplifier input signal $S_{IN}$. In this example, the input signal $S_{IN}$ and the compressing signal $S_{PC}$ are present in different bands as depicted in FIG. 3A. FIG. 3B shows the spectrum of the output from the main amplifier 18. The input signal $S_{IN}$ and the compressing signal $S_{PC}$ both contain distortion components $S_{IND}$ and $S_{PCD}$ produced by the main amplifier. In this case, too, the compressing signal $S_{PC}$ is regarded as a distortion in the main amplifier path 20L. The distortions $S_{IND}$ and $S_{PCD}$ by the main amplifier 18 are both detected and cancelled by the distortion canceling loop 20.

By canceling the component of the compressing signal $S_{PC}$ in the distortion canceling loop 20 as described above, it is possible to offer a peak power compressing scheme that is closed within the transmitting circuit. That is, the compressing signal power-combined with the transmission signal at the transmitting side need not be cancelled at the receiving side.

While in the above the compressing signal $S_{PC}$ has been described to be a tone signal, it may be a modulated wave as described later on.

Next, a description will be given of the PAPR compression by the compressing signal generator 16. The basic principle is the same as that for the before-mentioned peak power compression, but in this instance, the compressing signal $S_{PC}$ compresses PAPR of the input signal $S_{IN}$. The generation of the compressing signal $S_{PC}$ begins with the detection of PAPR of the input signal $S_{IN}$, and if PAPR is equal to or higher than a preset value, the compressing signal generator 16 determines the vector of the compressing signal $S_{PC}$ that will make PAPR of the combined signal $S_C$ go down below the preset value. This provides the combined signal $S_C$ with PAPR of the input signal $S_{IN}$ compressed. The PAPR compressing signal $S_{PC}$ can be produced, as described later on, by detecting and smoothing the envelope of the input signal and frequency-converting the envelope-smoothed signal to a band different from or the same as that of the input signal $S_{IN}$.

Figure 4A:
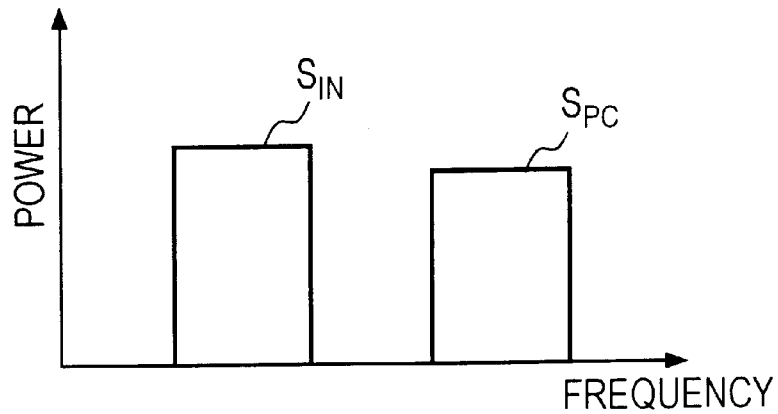
FIG. 4A is a graph showing the spectra of an input signal and a PAPR compressing signal.
Figure 4B:
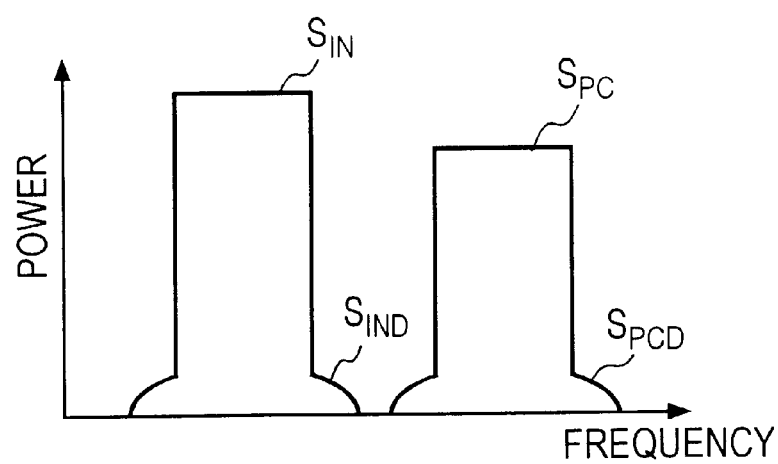
FIG. 4B is a graph showing the spectrum of a main amplifier output signal.
Figure 4C:
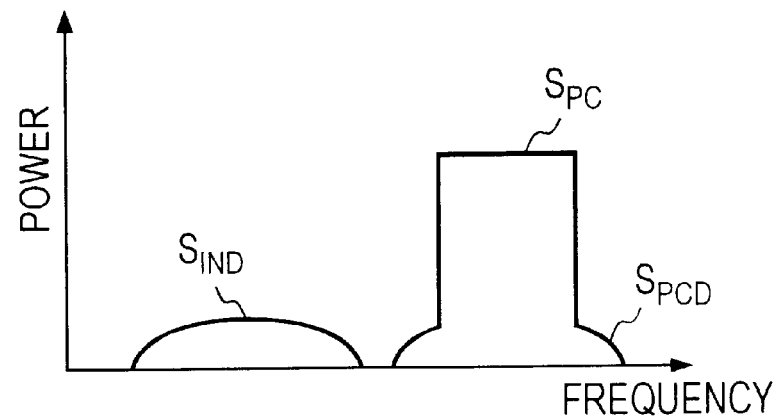
FIG. 4C is a graph showing the spectrum of a distortion detected by the distortion detecting loop.

FIG. 4A shows the case of injecting the PAPR compressing signal in a band higher than the transmission signal (the input signal $S_{IN}$). FIG. 4B shows the output spectrum from the main amplifier 18, which contains distortion components $S_{IND}$ and $S_{PCD}$ caused by the main amplifier 18. The compressing signal $S_{PC}$ is detected as one of the distortion components including $S_{IND}$ and $S_{PCD}$ as shown in FIG. 4C by the distortion detecting loop, and is cancelled by the distortion canceling loop 20. PAPR of the input signal $S_{IN}$ can be compressed, for example, by increasing the average power, or determining the vector of the compressing signal $S_{PC}$ so that the peak power is compressed, or by the combined use of the both methods.

Such a PAPR compressing signal $S_{PC}$ may be generated so that the amplitude of the combined signal $S_C$ takes a predetermined fixed value sufficiently smaller than a predictable peak of the input signal $S_{IN}$. FIG. 2 shows the locus of the signal in an IQ plane obtained by quadrature detection of the combined signal $S_C$. In this case, the envelope of the combined signal $S_C$ takes a constant value as indicated by the circle in FIG. 2. In the embodiments described later on, this compressing signal $S_{PC}$ will be referred to also as a constant-envelope signal.

Such a compression of PAPR of the transmission signal permits compression of the output backoff of the main amplifier 18. Further, it is possible to provide PAPR compression scheme that is completed within the transmitting circuit. Besides, the PAPR compression of the amplifier input signal reduces the output backoff, allowing high-efficiency amplification.

Embodiment 1

Figure 5:
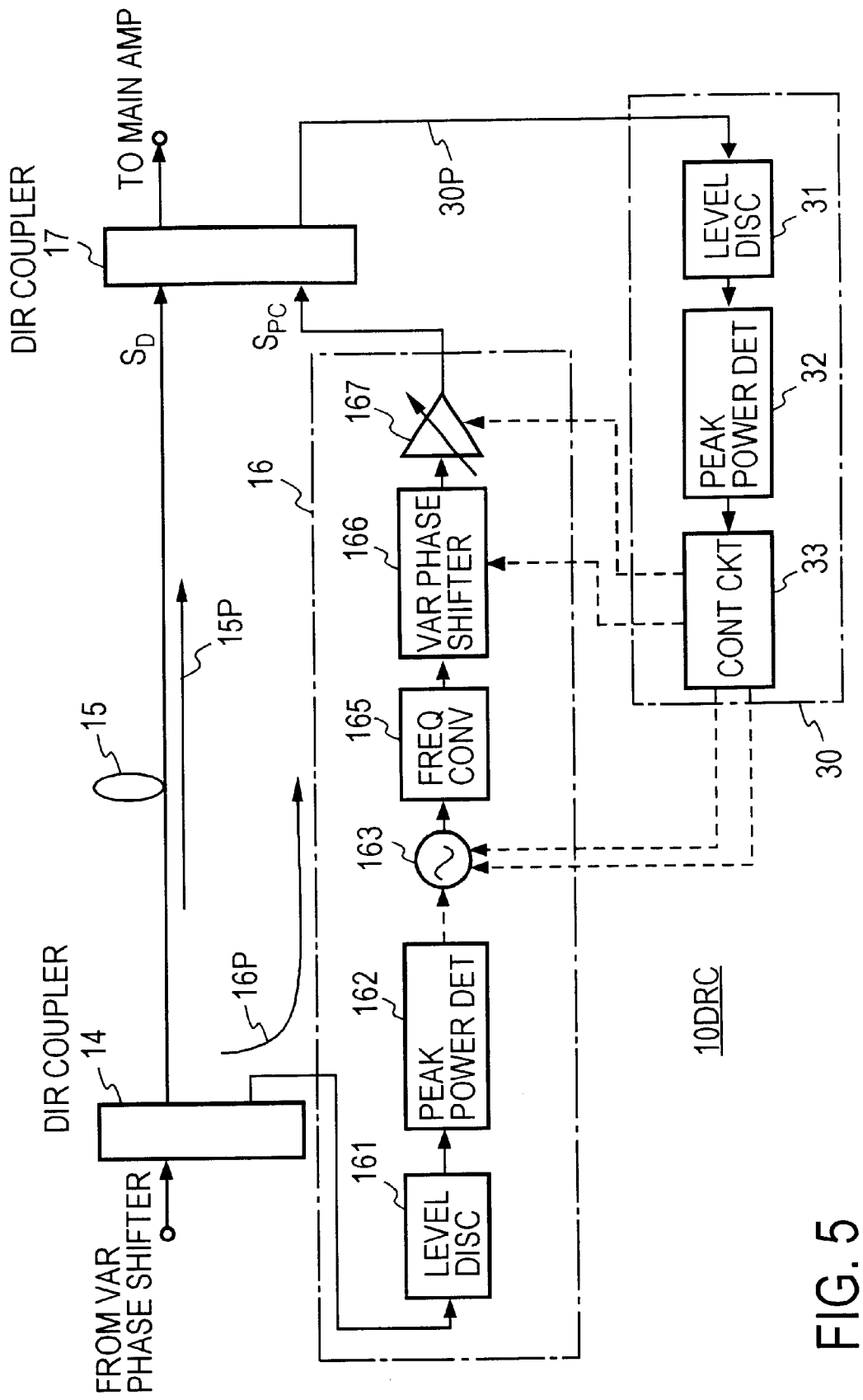
FIG. 5 is a block diagram of a dynamic range compressing circuit in a first embodiment of the present invention.

In FIG. 5 there is illustrated in block form the signal power dynamic range compressing circuit 10DRC for peak power compression. The input signal to the signal power dynamic range compressing circuit 10DRC is distributed by the directional coupler 14 to a linear signal transfer path 15P formed by the delay line 15 and a compressing signal generating path 16P formed by the compressing signal generator 16. The compressing signal generator 16 is formed by a cascade connection of a level discriminator 161, a peak power detector 162, a low-frequency oscillator 163, a frequency converter 165, a variable phase shifter 166 and a variable gain amplifier 167. The level discriminator 161 observes an instantaneous value of the amplitude of the distributed input signal $S'_{IN}$. The observed instantaneous amplitude value is compared with a threshold value $L_{th}$ preset in the level discriminator 161, and only when the former is larger than the latter, the distributed input signal $S'_{IN}$ is fed to the peak power detector 162. The peak power detector 162 is formed by a quadrature detector, which quadrature-detects the input signal $S'_{IN}$ fed from the output of the level discriminator 161, detecting the vector (amplitude and phase values) of the input signal $S'_{IN}$ during the peak power period. The thus detected amplitude and phase values are provided to the low-frequency oscillator 163.

The low-frequency oscillator 163 is formed by a synthesizer in which the amplitude and phase values can be set. To suppress the output backoff of the main amplifier 18, the low-frequency oscillator is set so that its oscillation signal is nearly 180° out of phase with the phase value detected during the peak power period. That is, the phase value that is set in the low-frequency oscillator 163 is an anti-phase version the phase value detected by the peak power detector 162. On the other hand, the amplitude value is chosen such that the combined signal $S_C$ estimated by the peak power detector 162 through numerical calculations will have a constant envelope. That is, the vector of the compressing signal $S_{PC}$ is chosen such that the peak power of the combined signal $S_C$ will takes a predetermined value smaller than the above-mentioned threshold value $L_{th}$. This permits generation of the compressing signal $S_{PC}$ of a vector that compresses the peak value of the input signal $S'_{IN}$.

The output from the synthesizer (the low-frequency oscillator 163) is frequency-converted by the frequency converter 165 to a predetermined band, which may be the same as or different from the band of the amplifier input signal. The frequency-converted compressing signal is finally adjusted in amplitude and in phase by the variable phase shifter 166 and the variable gain amplifier 167. The thus finally adjusted compressing signal is power-combined by the directional coupler 17 with the signal $S_D$ from the delay line 15. As the result of this, the peak power of the input signal is compressed. In this embodiment, the combined signal Sc is distributed to the main amplifier 18 and partly to a control path 30P by the directional coupler 17. The variable gain amplifier 167 may be composed of a variable attenuator and an amplifier.

In the basic configuration depicted in FIG. 1, since the vector of the input signal $S_{IN}$ varies with time, there is the possibility that the instantaneous amplitude value of the combined signal $S_C$, obtained by combining the vectors of the output signal $S_D$ from the delay line 15 and the compressing signal $S_{PC}$, exceeds the predetermined threshold value $L_{th}$ before the next peak value of the signal $S'_{IN}$ is detected by the level discriminator 161.

To avoid this, the FIG. 5 embodiment uses a compressing signal adjustment part 30 that is provided in the control path 30P by which to keep the level of the combined signal $S_C$ from exceeding the threshold value $L_{th}$. The compressing signal adjustment part 30 is formed, by a cascade connection of a level discriminator 31, a peak power detector 32 and a control circuit 33. The level discriminator 31 decides whether the peak power of the distributed combined signal $S_C$ is in excess of the threshold value $L_{th}$, and if so, transfers the combined signal $S_C$. The peak power detector 32 quadrature-detects the combined signal $S_C$ fed thereto to detect its phase and amplitude, and provides them to the control circuit 33. Based on the phase and amplitude thus detected, the control circuit 33 controls stepwise the phase shift amount of the variable shifter 166 and the amplification factor of the variable gain amplifier 167 by an adaptive algorithm so that the peak power of the combined signal $S_C$ becomes smaller than the threshold value $L_{th}$.

The control circuit 33 is formed by a microcomputer, which controls the variable phase shifter 166 and the variable gain amplifier 167 by a perturbation algorithm, least square estimation algorithm, or the like. The control operation of the control circuit 33 may be implemented by a digital or analog circuit. The variable gain amplifier 167 may be replaced with a variable attenuator, which also produces the above-described peak power compressing effect. The amplitude and phase values of the low-frequency oscillator 163 may also be placed under the control of the control circuit 33 as indicated by the broken lines in FIG. 5, in which case the variable phase shifter 166 and the variable gain amplifier 167 are omitted.

According to this embodiment, since the power dynamic range of the input signal $S_C$ to the main amplifier 18 can be compressed by the adaptive compression of its peak power, the output backoff of the main amplifier 18 can be reduced. This enables the main amplifier 18 to achieve high-efficiency amplification.

Figure 6:
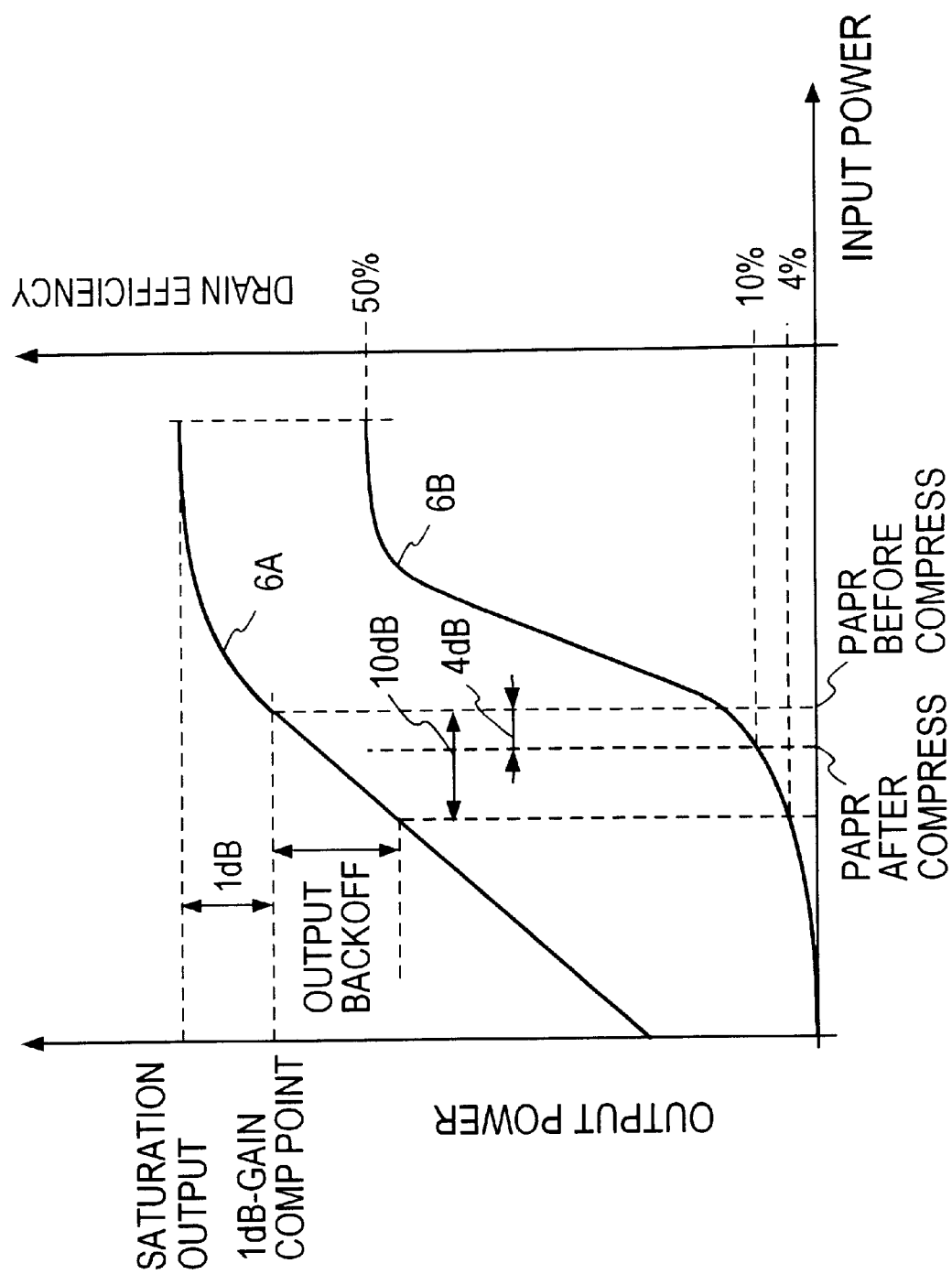
FIG. 6 is a graph conceptually showing operation characteristics, for explaining the amplification efficiency of a power amplifier embodying the present invention.

FIG. 6 shows the drain efficiency that is improved by the present invention. The curves 6A and 6B represent the output power performance and the drain efficiency performance with respect to the input power. For example, in the case of an input signal of a 10-dB PAPR, a 4-dB compression of its peak power will provide a PAPR reduction of the input signal down to 6 dB. When no peak power compression is carried out, the 10-dB output backoff is needed, but the peak power compression reduces the backoff down to 6 dB.

The 4-dB suppression of the backoff has improvement of the amplification efficiency of the main amplifier 18 as described below. Assuming that the main amplifier 18 is a Class-A amplifier whose maximum drain efficiency is 50% at the saturation output power and whose output backoff is defined to be the difference between a 1-dB gain compression point and the operating point (output power), the drain efficiency can be improved to about 10% by the application of the present invention, whereas the drain efficiency is 4% or so when the present invention is not used. Thus, even if the peak power is not completely compressed, the present invention is effective in improving the amplification efficiency of the main amplifier 18. And this does not ever generate either out-of-band leakage of power or intersymbol interference.

Embodiment 2

Figure 7:
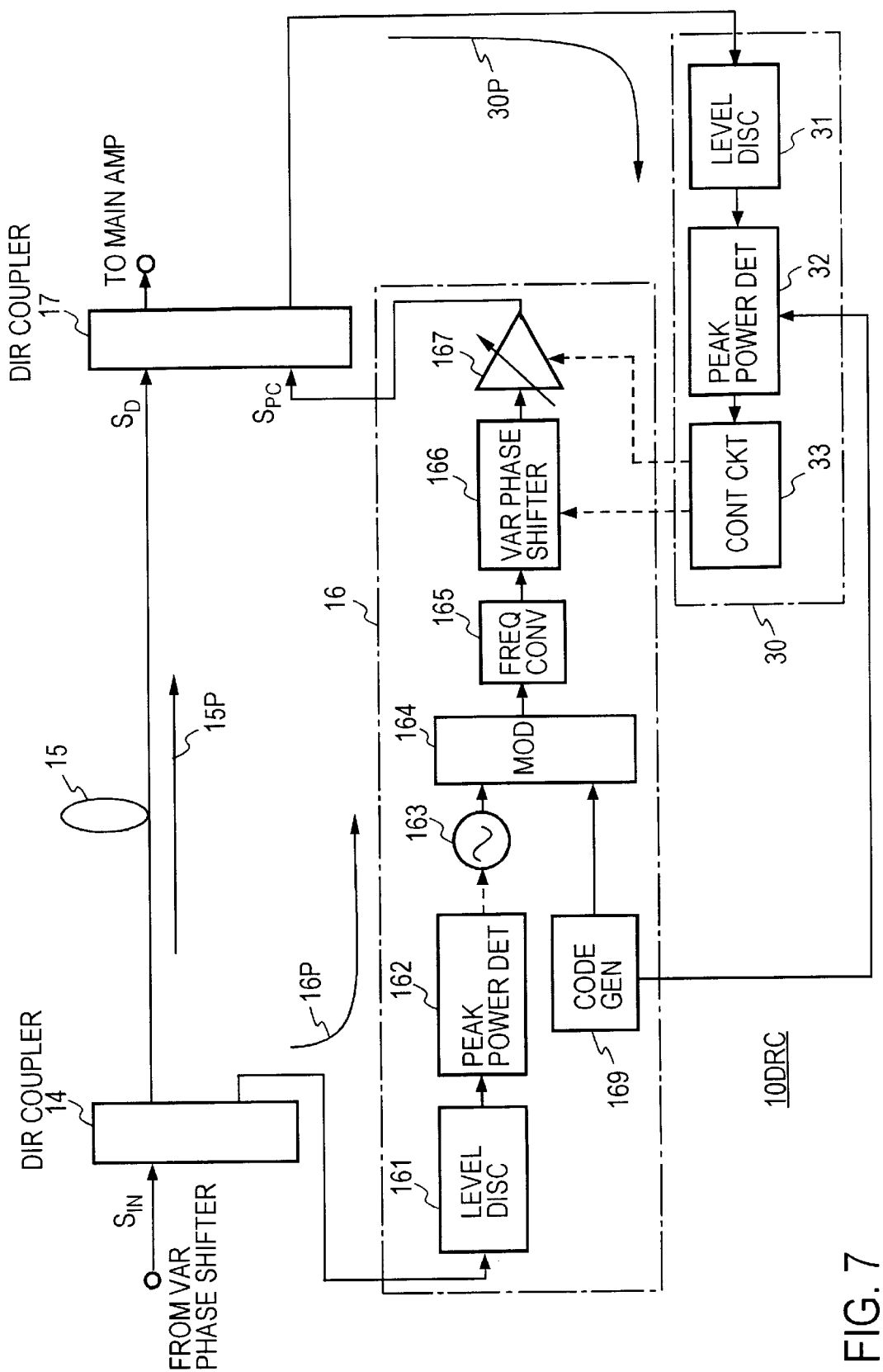
FIG. 7 is a block diagram of a dynamic range compressing circuit in a second embodiment of the present invention.

FIG. 7 illustrates in block form a second embodiment of the signal power dynamic range compressing circuit 10DRC. In this embodiment the signal generated by the low-frequency oscillator 163 of the compressing signal generator 16 in the FIG. 5 embodiment is modulated using a specific code. This scheme allows ease in detecting, by the peak power detector 32, the peak power of the combined signal $S_C$ that is used to control the variable phase shifter 166 and the variable gain amplifier 167. The compressing signal vector $S_{PC}$ from the low-frequency oscillator 163 is prone to undergo amplitude and phase variations under the influence of noise or the like. With a view to increasing the stability of the compressing signal, this embodiment generates a PN (pseudo random noise) or similar specific code by a code generator 169 and provides it to a modulator 164 to modulate the tone signal from the low-frequency oscillator 165. The thus modulated signal is provided via the frequency converter 165, the variable phase shifter 166 and the variable gain amplifier 167 to the directional coupler 17, wherein it is combined with the output from the linear signal transfer path 15P, and the combined signal $S_C$ is applied to the main amplifier 18.

In the path 30P (composed of the directional coupler 17, the level discriminator 31, the peak power detector 32 and the control circuit 33) for monitoring the peak power of the combined signal $S_C$, the level discriminator 31 monitors the peak power of the combined signal $S_C$. The peak power detector 32 detects control variables of the variable phase shifter 166 and the variable gain amplifier 167. At this time, the peak power detector 32 demodulates the input signal by the same code as that generated by the code generator 169. This provides increased stability for he compressing signal $S_{PC}$.

As is the case with the first embodiment, even if the compressing signal $S_{PC}$ is frequency-converted and combined with the signal $S_D$ from the linear signal transfer path 15P in the frequency band overlapping with that of the input signal $S'_{IN}$, the compressing signal component in the combined signal $S_C$ is detected, as part of the distortion developed in the main amplifier path, by the feed-forward-structured distortion detecting loop 10 and cancelled by the distortion canceling loop 20 in FIG. 1. In practice, the compressing signal component is not completely cancelled and remains in the transmission signal band, but it can be reduced down to a negligibly small value. The compressing signal may also be converted by the frequency converter 165 so that its component lies outside the frequency band of the input signal $S'_{IN}$, that is, outside the frequency band of the input signal $S_{IN}$.

Embodiment 3

The embodiments of FIGS. 5 and 7 detect and compress the peak power of the input signal, thereby compressing the dynamic range of the input signal power. The third embodiment is directed to the construction of the signal power dynamic range compressing circuit 10DRC designed to compress the dynamic range of the input signal power through PAPR compression of the input signal.

Figure 8:
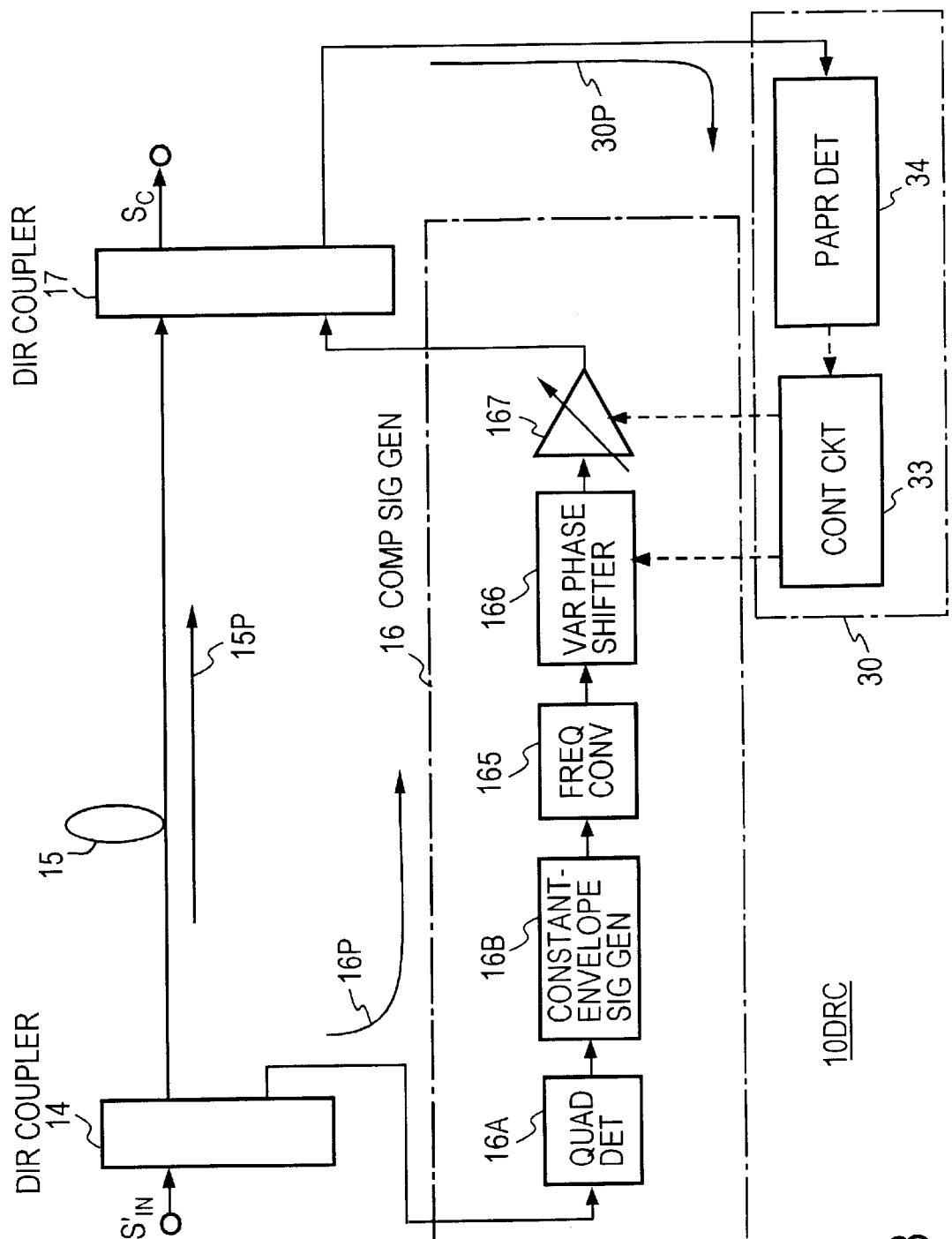
FIG. 8 is a block diagram of a dynamic range compressing circuit in a third embodiment of the present invention.

FIG. 8 illustrates in block form the signal power dynamic range compressing circuit 10DRC according to this embodiment. The input signal $S'_{IN}$ to the signal power dynamic range compressing circuit 10DRC is distributed by the directional coupler 14 to the linear signal transfer path 15P formed by the delay line 15 and the compressing signal generating path 16P with the compressing signal generator 16 inserted therein. The compressing signal generator 16 is formed by a cascade connection of a quadrature detector 16A, a constant-envelope signal generator 16B, the frequency converter 165, the variable phase shifter 166 and the variable gain amplifier 167. The quadrature detector 16A quadrature-detects the input signal thereto to observe or monitor its vector (phase and amplitude). The vector thus observed is provided to the constant-envelope signal generator 16B, which detects the envelope of the input signal from the observed phase and amplitude and outputs a signal that makes the envelope constant. At this time, the constant-envelope signal generator 16B sets the amplitude of the input signal to such a value that the combined signal $S_C$ will have a constant envelope. This provides a vector that compresses PAPR of the input signal.

The output from the constant-envelope signal generator 16B is frequency-converted by the frequency converter 165 to a predetermined band. In this instance, the output may be frequency-converted to a band which is the same as or different from the band of the feed-forward amplifier input signal $S_{IN}$. The frequency-converted compressing signal $S_{PC}$ is subjected to final adjustments to its amplitude and phase by the variable phase shifter 166 and the variable gain amplifier 167, thereafter being injected by the power combiner 17 into the main amplifier input signal. The variable gain amplifier 167 may be substituted with a variable attenuator, in which case, too, the same results as mentioned above are obtainable. The power of the combined signal $S_C$ is partly distributed by the directional coupler 17 to the control path 30P and provided to a PAPR detector 34. The PAPR detector 34 detects ratio between the peak and average voltages of the input signal or between its peak power and average power. Only when the detected ratio is above a preset threshold value, the PAPR detector 34 quadrature-detects the input signal, and the control circuit 33 stepwise effects control for rendering the combined signal $S_C$ to a constant-envelope signal by an adaptive algorithm.

That is, the signals $S_D$ and $S_{PC}$ will be 180° out of phase with each other in the IQ plane after quadrature detection of the combined signal $S_C$ from the directional coupler 17, but the vector of the combined signal $S_C$ does not always have a constant envelope. To avoid this, the control circuit 33 monitors the amplitude of the combined signal $S_C$ through the PAPR detector 34, and controls the variable phase shifter 166 and the variable gain amplifier 167 to adjust the phase and amplitude of the compressing signal $S_{PC}$ so that the combined signal $S_C$ will have a predetermined amplitude value. In other words, the variable gain amplifier 167 and the phase shifter 166 controls the amplitude and phase values of the constant-envelope signal $S_{PC}$ on the stepwise basis so that the combined signal $S_C$ will have a constant-envelope vector. This control can be provided by various adaptive algorithms such as the steepest descent method and the maximum likelihood estimation method.

The PAPR detector 34 can be implemented, for instance, by a diode sensor, in place of the quadrature detector. In the case of measuring the peak power, a diode sensor of a small time constant is used. The sensor output is sampled to detect instantaneous values of the sensor input voltage, and the maximum one of the measured instantaneous value is used as the peak power value. In the case of measuring the average power, a diode sensor of a large time constant is used; the sensor output is sampled and its average value is used as the average power. The same is true of the case where the diode sensor is replaced with a thermocouple sensor.

The control circuit 33 is formed by a microcomputer, and controls the variable phase shifter 166 and the variable gain amplifier 167 by a perturbation algorithm, least square estimation algorithm, or the like. The variable gain amplifier 167 may be replaced with a variable attenuator, in which case, too, it is possible to achieve the same PAPR reduction as described above.

This embodiment allows adaptive PAPR compression, and hence permits reduction of the output backoff of the main amplifier 18 and consequently its high-efficiency amplification. For example, as described previously with reference to FIG. 6, in the case of an input signal with a 10-dB PAPR, a 4-dB PAPR compression will reduce PAPR of the input signal to the main amplifier 18 by 4 dB. This permits reduction in the output backoff of 10 dB before the PAPR compression down to 6 dB. The 4-dB PAPR reduction has such an influence on the amplification efficiency of the main amplifier 18 as described below. Assuming that the main amplifier 18 is a Class-A amplifier whose maximum drain efficiency is 50% at the saturation output power and whose output backoff is defined to be the difference between a 1-dB gain compression point and the operating point, the drain efficiency can be improved to about 10% by the application of the present invention, whereas the drain efficiency is 4% or so prior to the application of the invention. Thus, the present invention does not achieve complete PAPR compression, but ensures high-efficiency amplification of the main amplifier. And this does not ever develop out-of-band leakage of power and intersymbol interference.

Figure 9A:
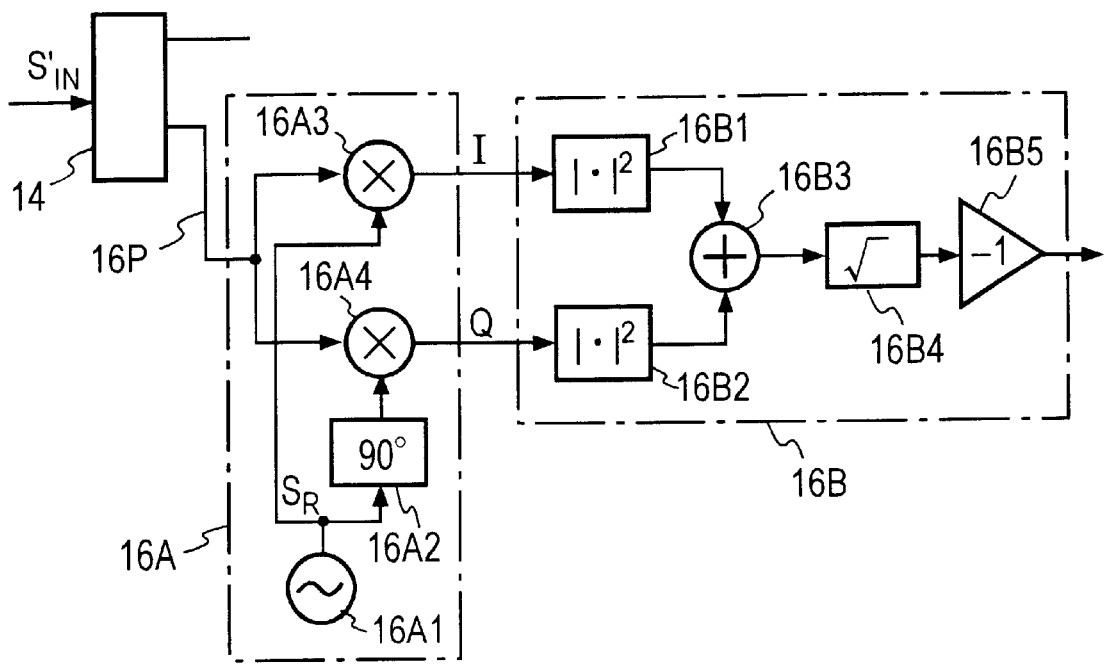
FIG. 9A is a block diagram depicting concrete examples of a quadrature detector 16A and a constant-envelope signal generator 16B in FIG. 8.

FIG. 9A illustrates in block form concrete examples of the quadrature detector 16A and the constant-envelope signal generator 16B in FIG. 8. The quadrature detector 16A comprises reference signal oscillator 16A1, for generating a reference signal $S_R$, a phase shifter 16A2 for shifting the phase of the reference signal $S_R$ by 90°, and multipliers 16A3 and 16A4 that multiply the signal provided from the directional coupler 14 to the compressing signal generating path 16P by the reference signal $S_R$ and its 90°-shifted version to generate in-phase component signal I an a quadrature component signal Q, respectively.

The constant-envelope signal generator 16B comprises square means 16B1 and 16B2, an adder 16B3, a root calculator 16B4 and a inverter 16B5. The in-phase component signal I and the quadrature component signal Q from the quadrature detector 16A are applied to the square means 16A and 16B, respectively, wherein their absolute values are squared, and the squared outputs are added together by the adder 16B3. The adder output is fed to the root calculator 16B4, wherein its square root is calculated to obtain an envelope signal of the input signal. This envelope signal is inverted by the inverter 16B5, which provides a baseband constant-envelope signal. The baseband constant-envelope signal is applied to the frequency converter 165 in FIG. 8.

Figure 9B:
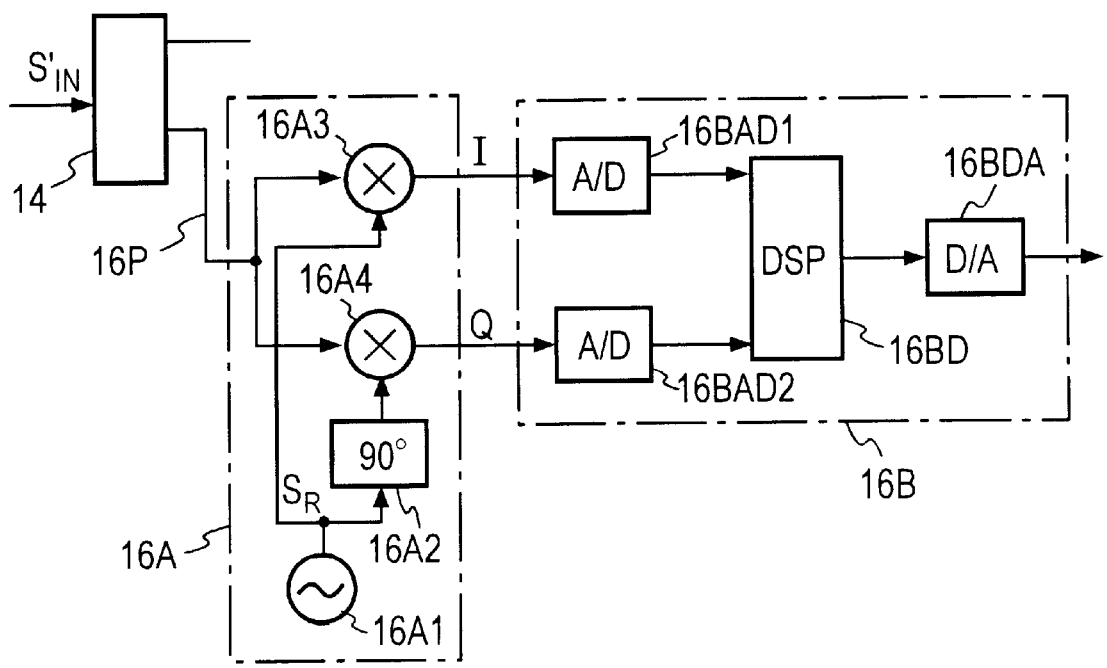
FIG. 9B is a block diagram depicting the circuit configuration for digital signal processing of the operation of the constant-envelope signal generator 16B in FIG. 9A.

FIG. 9B illustrates in block form an example in which the constant-envelope signal generator 16B in FIG. 9A is formed as a digital calculator circuit, which is made up of A/D converters 16BD1 and 16BD2, a digital signal processor (DSP) 16BD and a D/A converter 16BDA. The in-phase component signal I and the quadrature component signal Q from the quadrature detector 16A are converted by A/D converters 16BD1 and 16BD2 to digital signals, respectively, which are provided to the digital signal processor 16BD. The digital signal processor 16BD performs the processing by the square means 16B1 and 16B2, the adder 16B3, the root calculator 16B4 and the inverter 16B5 in FIG. 9A through digital calculations using the two digital signals from the A/D converters 16BD1 and 16BD2. The calculated result is provided to the D/A converter 16BDA, which converts the input digital signal to analog form, outputting the baseband constant-envelope signal.

Embodiment 4

Figure 10:
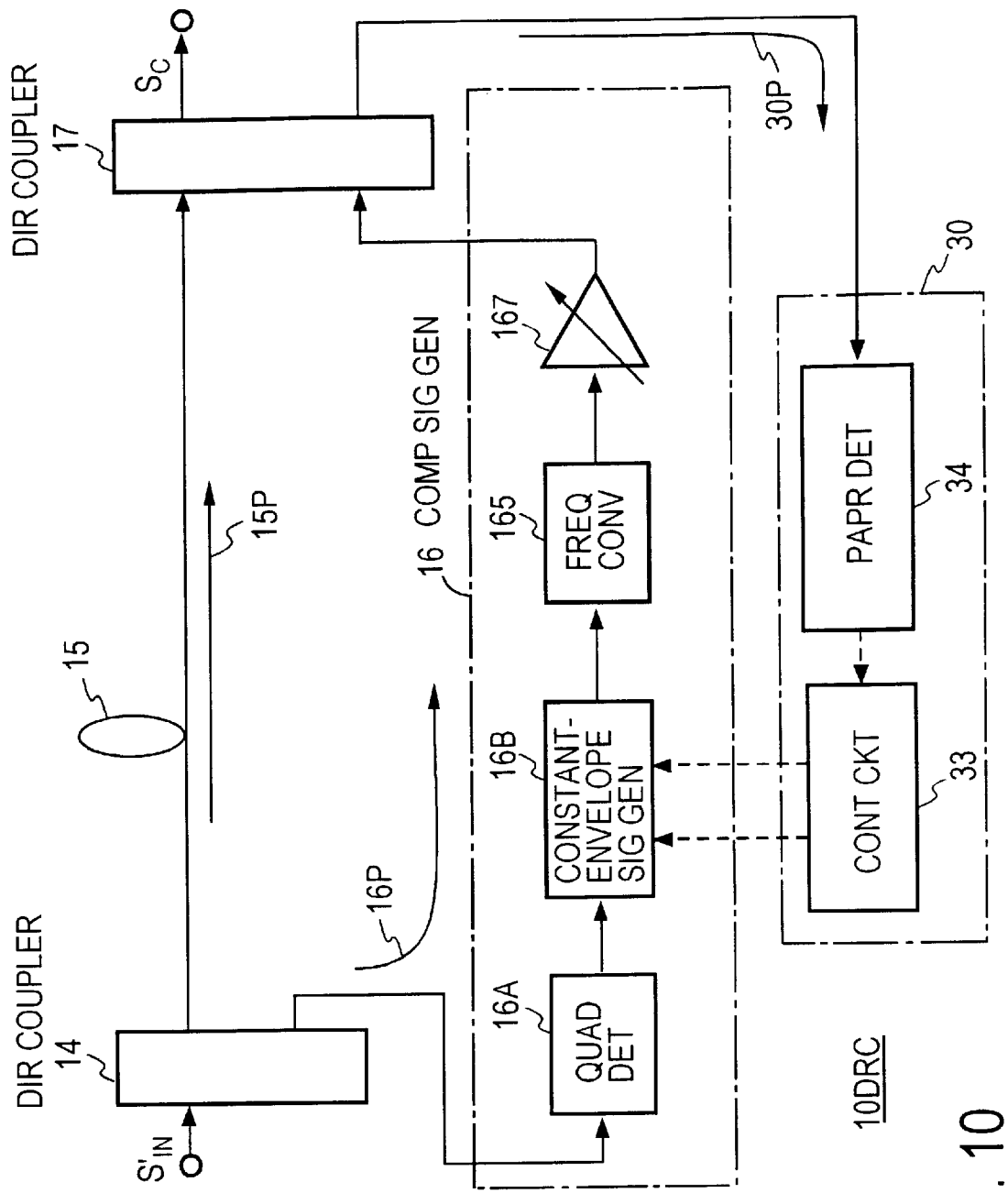
FIG. 10 is a block diagram of a dynamic range compressing circuit in a fourth embodiment of the present invention.

FIG. 10 illustrates in block form a fourth embodiment of the present invention adapted for PAPR compression. The compressing signal generator 16 comprises the quadrature detector 16A, the constant-envelope signal generator 16B, the frequency converter 165 and the amplifier 168.

The quadrature detector 16A performs quadrature detection of the input signal thereto to observe or monitor its vector (amplitude and phase value). The vector thus obtained is set by the constant-envelope signal generator 16B to be nearly 180° out of phase with the amplifier input signal $S_{IN}$ so as to suppress its PAPR. The output from the constant-envelope signal generator 16B is frequency-converted by the frequency converter 165 to a predetermined band. In this instance, the output may be frequency-converted to a band identical with or different from that of the feed-forward amplifier input signal $S_{IN}$. The frequency-converted compressing signal $S_{PC}$ is adjusted in level by the amplifier 168 and combined by the directional coupler 17 with the signal $S_D$ from the delay line 15, and the combined signal $S_C$ is applied to the main amplifier 18.

The control path 30P is composed of the PAPR detector 34 and the control circuit 33. The PAPR detector 34 detects the peak power and average power of the combined signal $S_C$ distributed from the directional coupler 17, and only when the ratio between the peak power and the average power is in excess of a preset threshold value, quadrature-detects the combined signal $S_C$ to obtain its phase and amplitude. Based on the phase and amplitude thus detected, the control circuit 33 stepwise controls the amplitude and phase values of the constant-envelope signal generator 16B so that PAPR of the main amplifier input signal goes down below the threshold value $L_{th}$. The control circuit 33 is formed by a microprocessor and uses the perturbation algorithm, least square estimation algorithm, or the like.

Further, the control circuit 33 controls the amplitude and phase values of the constant-envelope signal generator 16B in a manner to compress PAPR of the input signal to the main amplifier 18. This is equivalent to the PAPR suppression of the feed-forward amplifier input signal $S_{IN}$ in the base band.

Embodiment 5

Figure 11:
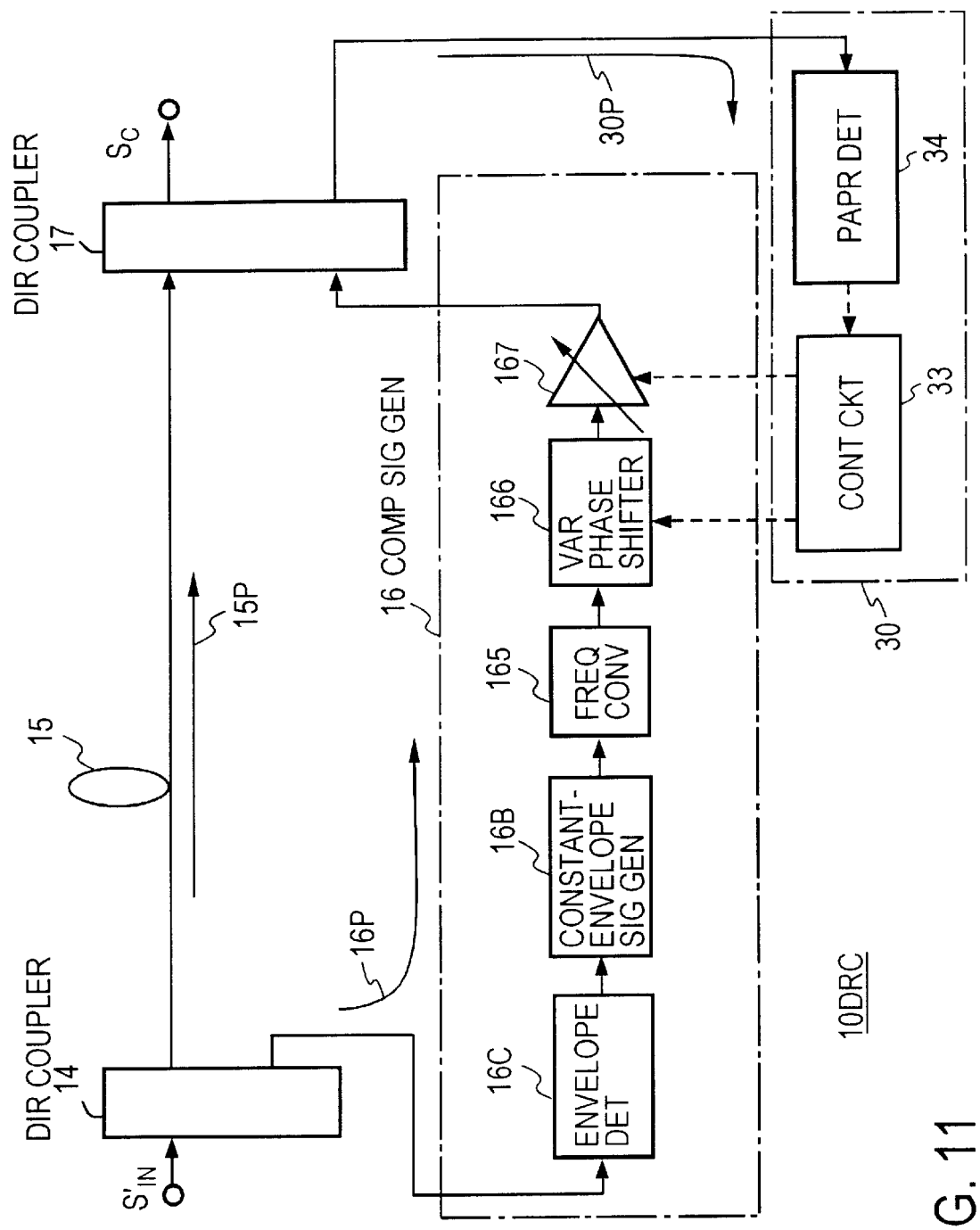
FIG. 11 is a block diagram of a dynamic range compressing circuit in a fifth embodiment of the present invention.

FIG. 11 illustrates in block form a fifth embodiment of the present invention, which uses an envelope detector 16C as a substitute for the quadrature detector 16A in the compressing signal generator 16 in the FIG. 8 embodiment. The scheme of this embodiment has the advantage of simplifying the configuration of the compressing signal generator 16. This embodiment is identical in construction with the FIG. 8 embodiment except the above; no further description will be given.

Embodiment 6

Figure 12:
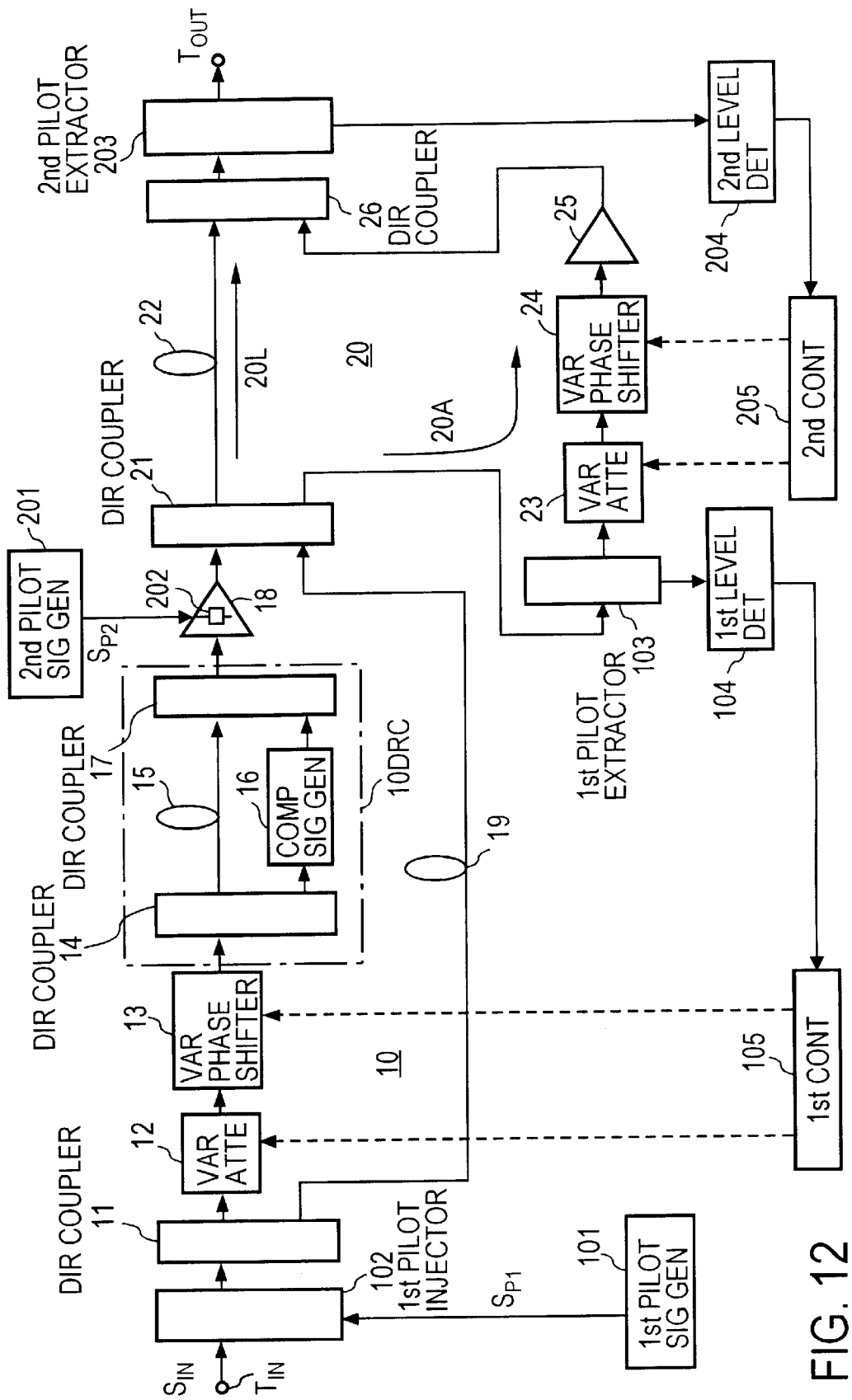
FIG. 12 is a block diagram depicting a sixth embodiment of the present invention which employs first and second pilot signals for equilibrium adjustment.

FIG. 12 illustrates in block form a sixth embodiment of the present invention, in which the feed-forward amplifier of FIG. 1 is provided with an arrangement that uses pilot signals to make adjustments for achieving the equilibrium of loops.

A first pilot signal $S_{P1}$ from a first pilot signal generator 101 is injected into the distortion detecting loop 10 by a first pilot injector 102 inserted in the input side of the directional coupler 11. At the same time, the first pilot signal $S_{P1}$ is extracted by a first pilot extractor 103 inserted in the input side of the distortion injecting path (the auxiliary amplifier path) 20A of the distortion canceling loop 20, and the level of the extracted first pilot signal is detected by a first level detector 104. The detected level is provided from the first level detector 104 to a first controller 105, which controls the variable attenuator 12 and the variable phase shifter 13 so that the detected level by the first level detector 104 becomes minimum. Similarly, a second pilot signal $S_{P2}$ from a second pilot signal generator 201 injected by a second pilot injector 202 into the main amplifier 18, and at the same time, the second pilot signal $S_{P2}$ is extracted by a second pilot extractor 203 inserted in the output side of the distortion canceling loop 20. The level of the second pilot signal $S_{P2}$ is detected by a second level detector 204, and the detected level is provided to a second controller 205. The second controller 205 controls the variable attenuator 23 and the variable phase shifter 24 so that the detected level by the second level detector 204 is minimized.

The amount of compensation for the nonlinear distortion of the feed-forward amplifier depends on the degree of equilibrium of each of the distortion detecting loop 10 and the distortion canceling loop 20. The equilibrium adjustment accuracy is disclosed in Japanese Pat. Pub. Gazette No. 77330/95 entitled "Automatic Adjustment Circuit of Feed-Forward Amplifier." For example, phase and amplitude deviations for obtaining an amount of distortion compression above 30 dB are within ±2 degrees and with ±0.3 dB, respectively; thus, severe requirements are imposed on the degree of equilibrium of each of the distortion detecting loop and the distortion canceling loop and on completeness of the equilibrium adjustment. As a method for achieving the equilibrium, there is proposed a method for automatic adjustment of the distortion detecting and canceling loops using pilot signals (Pat. Pub. Gazette No. 77330/95). It is known in the art that the distortion detecting and canceling loops can be brought into equilibrium using pilot signals by a device using this method (Toshio NOJIMA and Shoichi NARAHASHI, "Extremely Low-Distortion Multi-Carrier Amplifier for Mobile Communication Systems," Technical Report of IEICEJ, RCS90-4, 1990).

In the feed-forward amplifier of the present invention, the transmission signal (input signal) $S_{IN}$ component distributed to the main amplifier signal transfer path 10M is further divided by the directional coupler 14 of the dynamic range compressing circuit 10DRC and the one divided signal component is linearly transferred to the main amplifier 18 via the delay line 15 and the directional coupler 17. The temporal transfer characteristic of this signal is not affected by the compressing signal generator 16. Accordingly, the first pilot signal $S_{P1}$ reaches the main amplifier 18 via the same path as the transmission signal $S_{IN}$; hence, the compressing signal generator 16 does not exerts any influence on the phase and amplitude of the first pilot signal $S_{P1}$.

On the other hand, the first pilot signal $S_{P1}$ component distributed by the directional coupler 14 to the compressing signal generator 16 together with the transmission signal component can be prevented from affecting the transmission characteristic of the combined signal $S_C$, for example, by inserting a notch filter (not shown) in the compressing signal generation path 16P at an arbitrary position for rejecting the first pilot signal $S_{P1}$. Accordingly, the equilibrium adjustment of the distortion detecting loop 10 using the first pilot signal $S_{P1}$ can be made correctly as in the prior art. Hence, the injection of the compressing signal into the input to the main amplifier 18 will not affect the method for achieving the equilibrium of the distortion detecting loop 10 through the use of the pilot signal $S_{P1}$.

Conversely, the injection of the first pilot signal $S_{P1}$ into the distortion detecting loop 10 will not constitute any obstacle to the peak power or PAPR compression effect by the compressing signal because the compressing signal vector is generated which compresses the peak power or PAPR of the input signal $S_{IN}$, including the first pilot signal $S_{P1}$.

Embodiment 7

Figure 13:
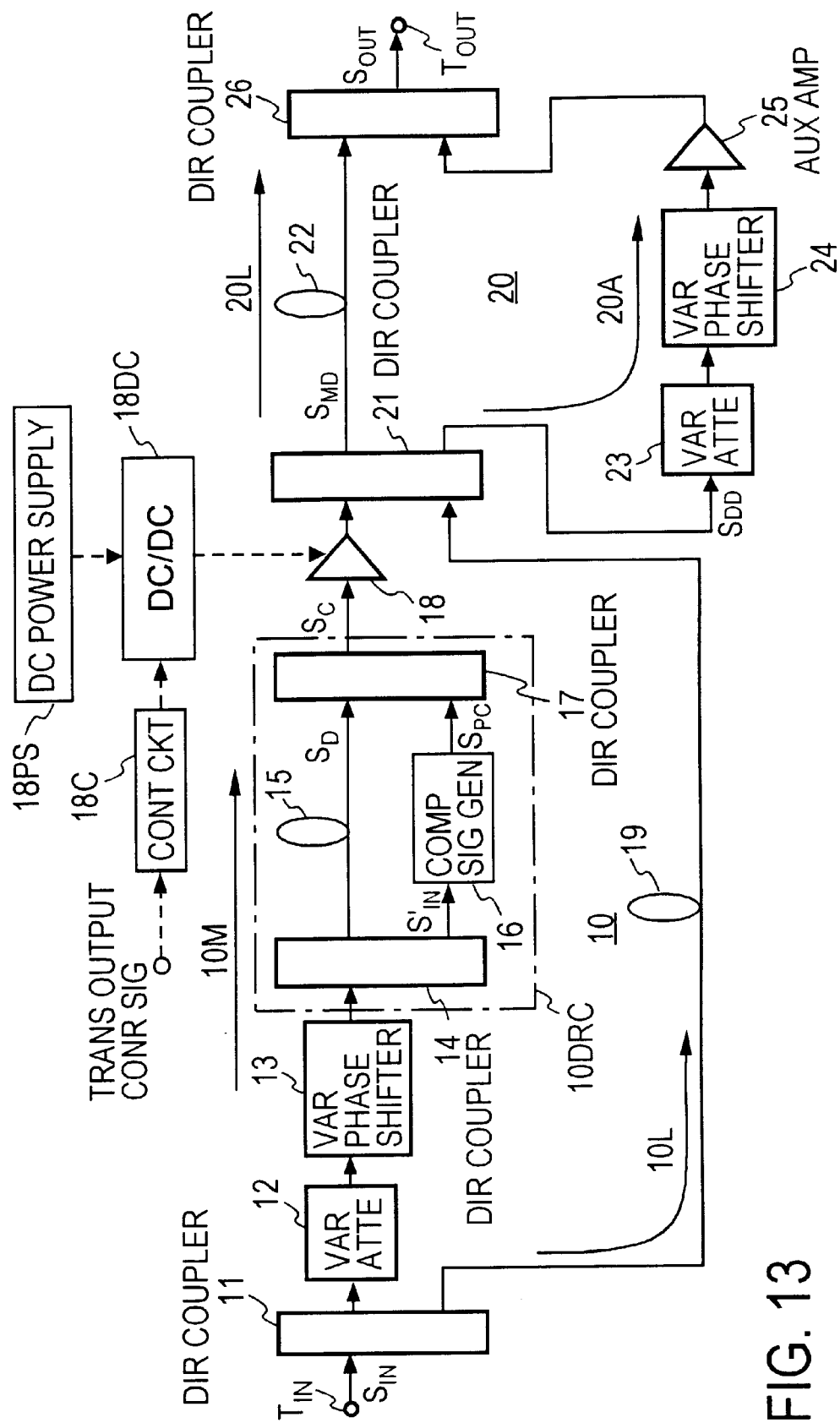
FIG. 13 is a block diagram depicting a seventh embodiment of the present invention combined with a high efficiency scheme by drain voltage control of the main amplifier.

FIG. 13 illustrates in block form a seventh embodiment of the present invention, which provides increased amplification efficiency by using a high-efficiency amplification techniques through drain voltage control of the main amplifier, in combination with the high-efficiency-oriented scheme that reduces the output backoff of the main amplifier 18 through the use of the compressing signal as described above. This can be done by the technique for high-efficiency amplification of the main amplifier 18 and the technique for increasing the amplification efficiency by reducing the output backoff of the main amplifier 18 according to the present invention. Moreover, the combined use of these techniques produces a synergistic effect to achieve higher-efficiency amplification. For example, as depicted in FIG. 13, the saturation voltage of the main amplifier 18 is controlled by a DC/DC converter 18DC to thereby increase the efficiency at the time of controlling the transmitting power and the output backoff of the main amplifier 18 is reduced by the present invention—this increases the efficiency of the feed-forward amplifier in its entirety.

When the main amplifier 18 is formed, for instance, by multi-stage cascade-connected FETs, the voltage from a DC power supply 18PS is controlled by the DC/DC converter 18DC, from which it is fed to the drain of the final-stage FET. On the other hand, a control circuit 18C responds to a transmitting output control signal to control the DC/DC converter 18DC to change its converted voltage, thereby controlling the saturation voltage of the final-stage FET. For example, when the transmitting output is smaller than a predetermined value, the control circuit 18C instructs the DC/DC converter 18DC to convert the input voltage to a predetermined small first drain voltage; when the transmitting output is larger than the predetermined value, the control circuit 18C controls the converter 18DC to converter the input voltage to a predetermined second drain voltage higher than the first drain voltage. This enhances the efficiency of the main amplifier 18. The transmitting output control signal may be, for example, an output signal obtained by envelope-detecting the input signal $S_{IN}$.

While the seventh embodiment has been described to control the FET drain voltage, it can readily be understood that the same results as mentioned above could also be obtained by controlling the gate voltage. Further, the drain and gate voltages may also be controlled at the same time.

EFFECT OF THE INVENTION

As described above, in the feed-forward amplifier according to the present invention, the signal power dynamic range compressing circuit does not clip the input signal, but instead generates a compressing signal based on the input signal, and power-combines the compressing signal with the input signal having passed through the linear signal transfer path to thereby compress the signal power dynamic range; hence, no out-of-band leakage of power occurs. Further, since the phase of the compressing signal is set in accordance with the input signal, the signal power dynamic range can effectively compressed even in the case where the input signal is a modulated wave and its phase varies. In consequence, the present invention brings about such advantages as listed below.

(1) High-efficiency amplification of the feed-forward amplifier is feasible without impairing its nonlinear distortion compensating ability.

(2) Since the signal power dynamic range compressing circuit is completed at the transmitting side, no processing is needed on the part of the receiving side.

(3) The feed-forward amplifier can be implemented with a simple circuit construction.

(4) Since a saturation amplifier can be used, high-efficiency amplification permits miniaturization and economization of the device.

(5) A synergistic effect can be produced by combining the present invention with the technique for higher efficiency of the main amplifier.

What is claimed is:

1. A feed-forward amplifier for amplifying a power of an input transmission signal and including a distortion detecting loop for detecting a distortion component and a distortion canceling loop cascade-connected to said distortion detecting loop for canceling said distortion component, wherein:

said distortion detecting loop comprises:
a main amplifier path containing a main amplifier;
a signal power dynamic range compressing circuit inserted in said main amplifier path at an input side of said main amplifier, for compressing a power dynamic range of said input transmission signal;
a first linear signal transfer path;
a first directional coupler for distributing said input transmission signal to said main amplifier path and said first linear signal transfer path; and
a second directional coupler for power-combining output signals from said main amplifier path and said first linear signal transfer path and for dividing said combined output signal into first and second combined outputs, said distortion canceling loop comprises:
a second linear signal transfer path supplied with the first combined output from said second directional coupler, for transferring said supplied first combined output;
an auxiliary amplifier path containing an auxiliary amplifier and supplied with the second combined output from said second directional coupler, for transferring said supplied second combined output; and
a third directional coupler for power-combining outputs from said second linear signal transfer path and said auxiliary amplifier path and for outputting said power-combined transmission signal, and said signal power dynamic range compressing circuit comprises:
a fourth directional coupler for dividing a signal on said main amplifier path into first and second signals and for outputting said first and second divided signals;
a third linear signal transfer path for linearly transferring the first divided signal from said fourth directional coupler;
a compressing signal generator for generating a compressing signal that makes an envelope of said first divided signal constant based on the second divided signal from said fourth directional coupler; and
a fifth directional coupler for power-combining an output signal from said third linear signal transfer path and said compressing signal from said compressing signal generator and for providing said power-combined output to said main amplifier.

2. The amplifier of claim 1, wherein said compressing signal generator comprises:
a level discriminator for detecting a peak power of said input transmission signal above a predetermined level;
a peak power detector for detecting a phase of said input transmission signal in response to the detection of said peak power;
a low-frequency oscillator for generating a low-frequency signal that is nearly 180° out of phase with said detected phase; and
a frequency converter for frequency-converting said low-frequency signal to a desired frequency band and for outputting said frequency-converted signal as said compressing signal.

3. The amplifier of claim 1, wherein said compressing signal generator comprises:
a level discriminator for detecting a peak power of said input transmission signal above a predetermined level;
a peak power detector for detecting an amplitude of said input transmission signal in response to the detection of said peak power;
a low-frequency oscillator in which said detected amplitude is set, for generating a low-frequency signal that is nearly 180° out of phase with a phase of said input transmission signal; and
a frequency converter for frequency-converting said low-frequency signal to a desired frequency band and for outputting said frequency-converted signal as said compressing signal.

4. The amplifier of claim 1, wherein said compressing signal generator comprises:
a level discriminator for detecting a peak power of said input transmission signal above a predetermined level;
a peak power detector for detecting a phase and amplitude of said input transmission signal in response to the detection of said peak power;
a low-frequency oscillator for generating a low-frequency signal that is nearly 180° out of phase with said detected phase;
a modulating signal generating means for generating a predetermined modulating signal;
a modulator circuit for modulating said low-frequency signal with said modulating signal to generate a modulated low-frequency signal; and
a frequency converter for frequency-converting said modulated low-frequency signal to a desired frequency band and for outputting said frequency-converted signal as said compressing signal.

5. The amplifier of claim 4, wherein said modulating signal generating means is a code generator for generating a code of a specific pattern as said modulating signal.

6. The amplifier of any one of claims 1 to 4, wherein said compressing signal generator comprises a variable phase shifter for adjusting the phase of said compressing signal and variable amplitude means for adjusting the amplitude of said compressing signal, and said signal power dynamic range compressing circuit further comprises a compressing signal adjustment part for controlling said variable phase shifter and said variable amplitude means so that the peak power of said combined signal distributed from said main amplifier goes down below a preset value.

7. The amplifier of claim 6, wherein said compressing signal adjustment part comprises:
combined signal level discriminating means for discriminating a level of said distributed combined signal above a predetermined value;
a combined signal peak power detector for detecting a phase and amplitude of said distributed combined signal in response to the detection of the level above said predetermined value; and
a control circuit for adjusting said variable phase shifter and said variable amplitude means based on said detected phase and amplitude of said distributed combined signal so that the level of said distributed combined signal goes down below said predetermined value.

8. The amplifier of claim 1, wherein said compressing signal generator comprises:
   a quadrature detector for quadrature-detecting said input transmission signal and for outputting its phase and amplitude;
   a constant-envelope signal generator for generating from said phase and amplitude of the input transmission signal a signal for making the input transmission signal have a constant envelope; and
   a frequency converter for converting said signal from said constant-envelope signal generator to a desired frequency band and for outputting said frequency-converted signal as said compressing signal.

9. The amplifier of claim 1, wherein said compressing signal generator comprises:
   an envelope detector for envelope-detecting said input transmission signal and for outputting its phase and amplitude;
   a constant-envelope signal generator for generating from said phase and amplitude of the input transmission signal a signal for making the input transmission signal have a constant envelope; and
   a frequency converter for converting said signal from said constant-envelope signal generator to a desired frequency band and for outputting said frequency-converted signal as said compressing signal.

10. The amplifier of claim 8 or 9, wherein said compressing signal generator comprises a variable phase shifter for adjusting the phase of said compressing signal and variable amplitude means for adjusting the amplitude of said compressing signal, and said signal power dynamic range compressing signal further comprises a compressing signal adjustment part for controlling said variable phase shifter and said variable amplitude means so that the peak power of said combined signal distributed from said main amplifier goes down below a preset value.

11. The amplifier of claim 10, wherein said compressing signal adjustment part comprises peak-to-average power ratio detecting means for detecting a peak-to-average power ratio of said distributed combined signal above a predetermined value, and a control circuit for adjusting said variable phase shifter and said variable amplitude means in response to the detection of said peak-to-average power ratio above said predetermined value so that said peak-to-average power ratio of said distributed combined signal goes down below said predetermined value.

12. The amplifier of claim 2 or 3, wherein said signal power dynamic range compressing circuit further comprises a compressing signal adjustment part for controlling said low-frequency oscillator so that the peak power of said combined signal distributed from said power combiner goes down below a predetermined value.

13. The amplifier of claim 12, wherein said compressing signal adjustment part comprises:
   combined signal level discriminating means for discriminating a level of said distributed combined signal above a predetermined value;
   a combined signal peak power detector for detecting the phase and amplitude of said distributed combined signal in response to the detection of the level above said predetermined value; and
   a control circuit for adjust said variable phase shifter and said variable amplitude means based on said detected phase and amplitude of said distributed combined signal so that the level of said distributed combined signal goes down below said predetermined value.

14. The amplifier of claim 8 or 9, wherein said signal power dynamic range compressing circuit further comprises a compressing adjustment part for controlling said constant-envelope signal generator so that a peak-to-average power ratio of said combined signal distributed from said power combiner goes down below a predetermined value.

15. The amplifier of claim 14, wherein said compressing signal adjustment part comprises peak-to-average power ratio detecting means for detecting the peak-to-average power ratio of said distributed combined signal above a predetermined value, and a control circuit for adjusting said variable phase shifter and said variable amplitude means in response to the detection of said peak-to-average power ratio above said predetermined value so that said peak-to-average power ratio of said combined signal goes down below said predetermined value.

16. The amplifier of any one of claims 2, 3, 4, 8 or 9, wherein said frequency converter frequency-converts said low-frequency signal to a frequency band different from that of said input transmission signal.

17. The amplifier of any one of claims 2, 3, 4, 8 or 9, wherein said frequency converter frequency-converts said low-frequency signal to a frequency band identical with that of said input signal.

18. The amplifier of any one of claims 1, 2, 3, 4, 8, or 9, further comprising:
   means for generating a first pilot signal;
   means for injecting said first pilot signal into an input path of said distortion detecting loop;
   first electrically variable attenuator means and first electrically variable phase shifter means inserted in said distortion detecting loop;
   means for generating a second pilot signal;
   means inserted in a path of said main amplifier of said distortion detecting loop, for injecting said second pilot signal into said main amplifier;
   means inserted in said distortion canceling loop, for detecting said first pilot signal;
   second electrically variable attenuator and second electrically variable phase shifter means inserted in said distortion canceling loop;
   means inserted in an output path of said distortion canceling loop, for detecting said second pilot signal;
   first level detecting means for detecting a level of said detected first pilot signal;
   second level detecting means for detecting a level of said detected second pilot signal; and
   control means for controlling said first electrically variable attenuator means and said first electrically phase shifter means in a manner to minimize the detected level by said first level detecting means, and for controlling said second electrically variable attenuator means and said second electrically phase shifter means in a manner to minimize the detected level by said second level detecting means.

19. The amplifier of any one of claims 1, 2, 3, 4, 8 and 9, wherein said main amplifier is a saturation amplifier.

20. The amplifier of any one of claims 1, 2, 3, 4, 8 or 9, further comprising voltage control means for controlling a voltage to be applied to a semiconductor device of said main amplifier.

21. A power amplifying method for power-amplifying an input transmission signal by a feed-forward amplifier provided with a distortion detecting loop for detecting a distortion component and a distortion canceling loop cascade-connected to said distortion detecting loop, for canceling said distortion component, said method comprising the steps of:

(a) distributing said input transmission signal to a first linear signal transfer path and a main amplifier path;

(b) distributing said input transmission signal, distributed to said main amplifier, to a second linear signal transfer path and a compressing signal generating path;

(c) generating, based on said input transmission signal distributed to said compressing signal generating path, a compressing signal for making a constant-envelope said signal distributed to said second linear signal transfer path;

(d) power-combining said compressing signal and an output from said second linear signal transfer path and power-amplifying said combined signal by a main amplifier of said main amplifier path;

(e) power-combining an output from said main amplifier path and an output from said first linear signal transfer path and distributing said power-combined signal to a third linear signal transfer path and an auxiliary amplifier path; and (f) power-combining an output from said auxiliary amplifier path and an output from said third linear signal transfer path to cancel a distortion component of said input transmission signal transferred over said third linear signal transfer path and outputting said input transmission signal amplified in power.

22. The method of claim 21, wherein said step (c) is a step of detecting a peak power of said signal distributed to said compressing signal generating path and generating said compressing signal for compressing the peak power of said signal distributed to said second linear signal transfer path.

23. The method of claim 21, wherein said step (c) is a step of detect a peak-to-average power ratio of said signal distributed to said compressing signal generating path and generating said compressing signal for compressing the peak-to-average power ratio of said signal distributed to said second linear signal transfer path.

* * * * *